(12) United States Patent
Nittel et al.

(10) Patent No.: US 12,588,158 B2
(45) Date of Patent: Mar. 24, 2026

(54) DRIVE SYSTEM HAVING A CENTRAL MODULE, DISTRIBUTORS AND DRIVES

(71) Applicant: SEW-EURODRIVE GMBH & CO. KG, Bruchsal (DE)

(72) Inventors: Tobias Nittel, Ettlingen (DE); Martin Süß, Weiterstadt (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 168 days.

(21) Appl. No.: 18/578,836

(22) PCT Filed: Jun. 14, 2022

(86) PCT No.: PCT/EP2022/066177
§ 371 (c)(1),
(2) Date: Jan. 12, 2024

(87) PCT Pub. No.: WO2023/285060
PCT Pub. Date: Jan. 19, 2023

(65) Prior Publication Data
US 2024/0306337 A1     Sep. 12, 2024

(30) Foreign Application Priority Data
Jul. 12, 2021    (DE) .......................... 102021003543.7

(51) Int. Cl.
*H05K 7/14*              (2006.01)
(52) U.S. Cl.
CPC .................................. *H05K 7/1432* (2013.01)
(58) Field of Classification Search
CPC ...... H04B 3/02; G05B 19/4141; H02K 5/225; H02K 11/33; H02P 27/04
See application file for complete search history.

(56) References Cited

U.S. PATENT DOCUMENTS 6,790,050 B1 *  9/2004  Roth-Stielow ....... H05K 7/1479
                                                             361/752
8,303,337 B2 * 11/2012  Ballard ................. H01B 9/003
                                                             439/578
(Continued)

FOREIGN PATENT DOCUMENTS

DE        3613294 A1    10/1987
DE      19905952 A1     9/2000
(Continued)

OTHER PUBLICATIONS

Machine Translation for DE102011118361A1 (Year: 2025).*
(Continued)

*Primary Examiner* — Allen L Parker
*Assistant Examiner* — Peter Krim
(74) *Attorney, Agent, or Firm* — Carter, DeLuca & Farrell LLP

(57)                ABSTRACT

A drive system includes a central module, distributors, and drives. Each drive is assigned a respective distributor. A first hybrid cable is led from the respective drive through a respective first cable gland of the respective distributor into the respective distributor, a second hybrid cable is led from the central module through a second cable gland into a first distributor, and a further second hybrid cable is led from a respective distributor through a further second cable gland into a respective distributor arranged downstream. A respective first data cable is led from the respective drive through a respective third cable gland into the respective distributor, and a respective second data cable is led from the respective drive through a respective third cable gland into the respective distributor.

24 Claims, 5 Drawing Sheets

(56) References Cited

U.S. PATENT DOCUMENTS

| | | | |
|---|---|---|---|
| 10,774,982 B2 | 9/2020 | Sung | |
| 2005/0272319 A1* | 12/2005 | Schmidt | H05K 7/1462 |
| | | | 439/894 |
| 2014/0096996 A1* | 4/2014 | Sidlyarevich | H01B 7/04 |
| | | | 156/50 |
| 2016/0050029 A1* | 2/2016 | Huegerich | G02B 6/4293 |
| | | | 398/116 |
| 2018/0151271 A1* | 5/2018 | Sidlyarevich | H02K 11/21 |
| 2018/0329162 A1* | 11/2018 | Claessens | G02B 6/44526 |
| 2022/0407382 A1* | 12/2022 | Stanek | H02K 5/225 |

FOREIGN PATENT DOCUMENTS

| | | | | |
|---|---|---|---|---|
| DE | 10206107 A1 | 9/2002 | | |
| DE | 10351532 A1 | 6/2005 | | |
| DE | 102011118361 A1* | 5/2013 | | G05B 19/4141 |
| DE | 19964437 B4 | 10/2018 | | |
| DE | 102018101210 B4 | 8/2019 | | |
| WO | WO-2011000456 A2* | 1/2011 | | H02K 5/225 |

OTHER PUBLICATIONS

Drawings for DE102011118361A1 (Year: 2025).*
Machine Translation for WO2011000456A1 (Year: 2025).*
International Search Report issued in corresponding International Application No. PCT/EP2022/066177 dated Oct. 10, 2022, pp. 1-2, English Translation.
International Report on Patentability issued in corresponding International Application No. PCT/EP2022/066177, dated Jan. 16, 2024, pp. 1-9, English Translation.

* cited by examiner

DRIVE SYSTEM HAVING A CENTRAL MODULE, DISTRIBUTORS AND DRIVES

FIELD OF THE INVENTION

The present invention relates to a drive system having a central module, distributors, and drives.

BACKGROUND INFORMATION

In certain conventional systems, a drive has an electric motor.

A rail distribution system is described in German Patent Document No. 103 51 532.

A distribution box is described in German Patent Document No. 199 05 952.

A distributor is described in German Patent Document No. 199 64 437.

A device for controlling multiple drive units is described in German Patent Document No. 10 2011 118 361.

A wall mounting for an electronic display is described in German Patent Document No. 10 2018 101 210.

A brake for a motor is described in German Patent Document No. 36 13 294.

SUMMARY

Example embodiments of the present invention provided a drive system, in which cost-effective production and/or start-up of the drive system is possible.

According to example embodiments of the present invention, a drive system includes a central module, distributors, and drives. Each drive is assigned a respective distributor. A first hybrid cable is led from the respective drive through a respective first cable gland of the respective distributor into the respective distributor, and a second hybrid cable is led from the central module through a second cable gland into a first distributor. A further second hybrid cable is led from a respective distributor through a further second cable gland into a respective distributor arranged, e.g., in a line, e.g., in a series, downstream. A respective first data cable is led from the respective drive through a respective third cable gland into the respective distributor, and a respective second data cable is led from the respective drive through a respective third cable gland into the respective distributor.

Thus, the data line can be arranged as an Ethernet line, since it is not arranged as a stub line, but rather a first data line is led from the distributor to the drive and a second data line from the drive to the distributor. Thus, only the low-voltage cables and extra-low voltage cables are led as a stub line from the distributor to the drive. Thus, separate cable glands for the two data cables must be provided on the distributor. The drive has an electric motor fed by an inverter. The inverter includes signal electronics to which the two data cables, e.g., the data lines of the two data cables, are electrically connected. This provides for fast data exchange. This is because the data intended for the inverter arranged as a bus subscriber can be fed directly to the inverter, while the data intended for other bus subscribers can be forwarded via the respective data cable.

According to example embodiments, the central module is arranged in a switch cabinet. Thus, the central module can be arranged protected, i.e., outside the field of the system.

According to example embodiments, the central module includes: a low-voltage connection, e.g., one that is connected to a three-phase voltage network; an extra-low voltage connection, e.g., one that provides a 24-volt power supply; and a controller connected to drives of the drive system for data exchange.

Thus, power and data signals as well as an extra-low voltage supply of 24 volts can be provided by the central module. The second hybrid cable is connected to the central module and transmits low voltage, extra-low voltage, and data signals.

According to example embodiments, the first hybrid cable includes: low-voltage lines, e.g., low-voltage lines with neutral conductors; and extra-low voltage lines.

Thus, the first hybrid cable has a smaller diameter than the second hybrid cable, since the second hybrid cable, unlike the first hybrid cable, also includes a shielded data line.

According to example embodiments, the second hybrid cable includes: low-voltage lines, e.g., low-voltage lines with neutral conductors; extra-low voltage lines; and a data line.

Thus, the first hybrid cable has a smaller diameter than the second hybrid cable, since the second hybrid cable, unlike the first hybrid cable, also includes a shielded data line.

According to example embodiments, the distributor has a lower part and an upper part placed thereon, and all cable glands are arranged in the lower part. Thus, the wiring can be carried out in the lower part, and the upper part has a labeling surface for identifying the cable glands.

According to example embodiments, a switch is arranged in the lower part, which can be actuated coming from the outside, e.g., from the outer environment of the lower part, and the low-voltage lines of the first hybrid cable can be disconnected, e.g., electrically disconnected, via the switch. Thus, the power supply to the drive can be switched off. Nevertheless, data can still be exchanged and the signal electronics thus remain programmable or controllable. The signal electronics can be supplied from the extra-low voltage.

According to example embodiments, the lower part is shaped like a box. Thus, cost-effective production is possible. The lower part is, for example, cuboid and has four sides.

According to example embodiments, the lower part has a bottom wall, e.g., a bottom side, which is adjacent to at least one front wall, e.g., a front side, of the lower part. A first side wall, e.g., a first side, of the lower part is adjacent to the bottom wall and to the front wall, and a second side wall, e.g., a second side, of the lower part is adjacent to the bottom wall and to the front wall and is at a distance from the first side wall. For example, the second side wall is aligned parallel to the first side wall, and/or the second side wall is arranged opposite the first side wall on the lower part. Thus, ready production is possible.

According to example embodiments, the first cable gland is arranged in the front wall. Thus, the front wall can be aligned downwards in the direction of gravity, and, thus, the weight of the first hybrid cable pulls the distributor downwards so that the fastening of the distributor is further secured. This is because the U-shaped foot parts formed on the lower part are pressed more firmly onto bolts or screws fastened in a wall of the system.

According to example embodiments, the third cable gland is arranged in the front wall. Thus, data cables can be led into the interior in a sealed manner.

According to example embodiments, the second cable gland is arranged in the second side wall. Thus, a simple loop-through can be achieved via the second hybrid cables on the second side wall.

According to example embodiments, the switch for disconnecting the low-voltage lines of the first hybrid cable is arranged in the first side wall. Thus, the actuation of the switch is as far away as possible from the second side wall with its second looped-through hybrid cables.

According to example embodiments, an eyelet is formed on the lower part. For example, the clear inside diameter of the eyelet decreases, e.g., monotonously, with increasing distance from the first cable gland. The clear inside diameter is measured perpendicular to a straight line connecting the eyelet and the first cable gland. Thus, a bayonet catch can be achieved. Since the eyelet is arranged above the foot parts in the direction of gravity, the weight of the distributor and the tensile force of the first hybrid cable presses the distributor onto the bolts, while the eyelet with its narrowed region is clamped on the bolt protruding through the eyelet.

According to example embodiments, the upper part has a flat surface section arranged as a labeling surface, and the surface section has a smaller distance to the first, second, and/or third cable gland than to the eyelet. Thus, cabling errors can be reduced.

According to example embodiments, further cable glands, e.g., unused cable glands, are arranged on the lower part, e.g., on the front wall and on the second side wall. Thus, separate low-voltage cables, extra-low voltage cables, and data cables can be used instead of hybrid cables, and, however, the same distributor can be used.

According to example embodiments, the data line of the second hybrid cable is led through the first data cable or electrically connected to a data line of the first data cable, and the data line of the further second hybrid cable is led through the second data cable or is electrically connected to a data line of the second data cable. Thus, the data line is not routed as a stub line. This means that an Ethernet data bus can be used, and the data lines can be used as Ethernet data lines.

Further features and aspects of example embodiments of the present invention are explained in more detail below with reference to the appended schematic Figures.

DETAILED DESCRIPTION

Figure 1:
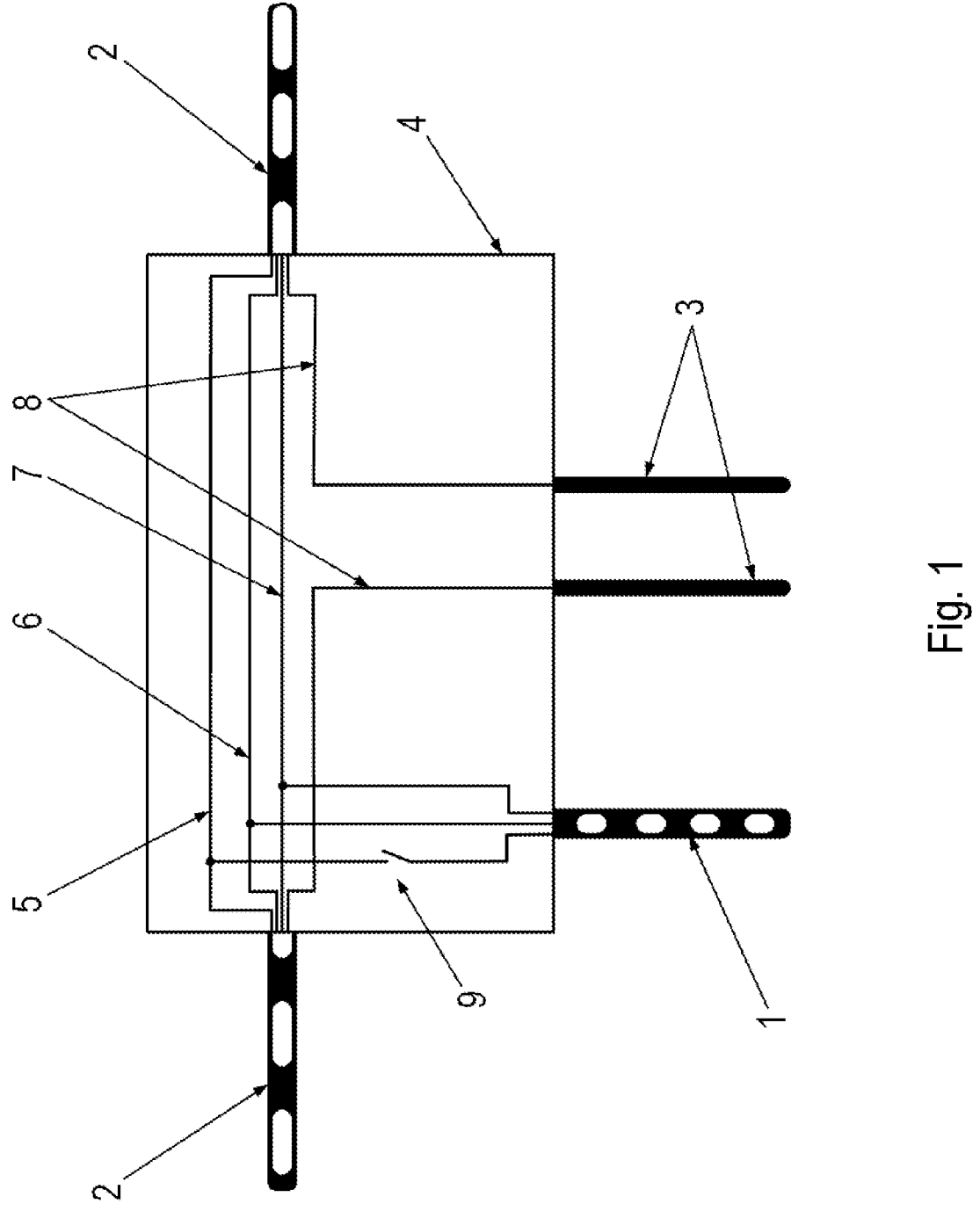
FIG. 1 illustrates a distributor of a drive system.
Figure 2:
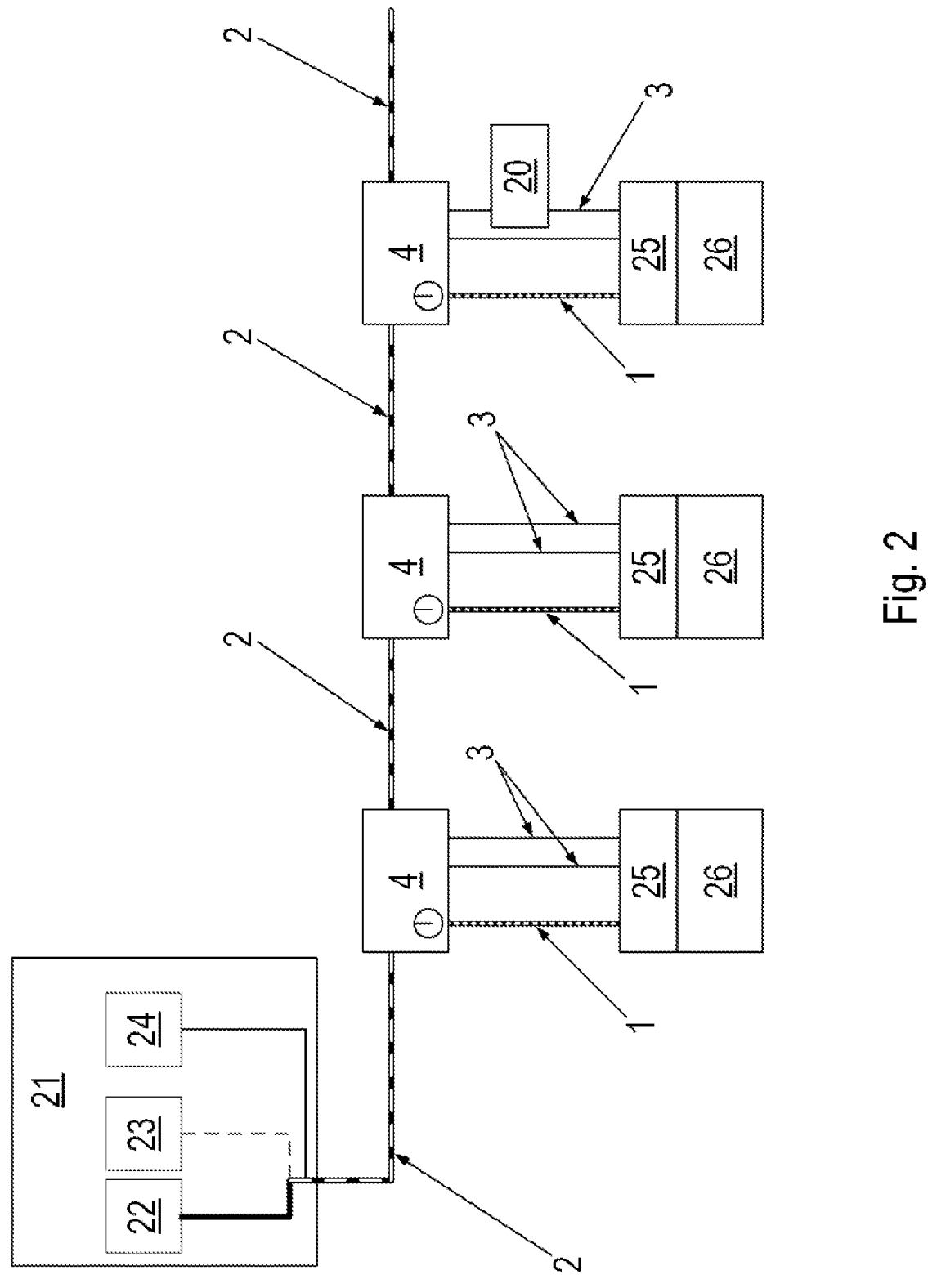
FIG. 2 illustrates the drive system with several distributors.

As schematically illustrated in the Figures, the drive system has a central module, e.g., arranged in a switch cabinet 21.

The central module includes a low-voltage connection 22, e.g., connected to a three-phase voltage network, an extra-low voltage connection 23, which provides, for example, a 24-volt voltage supply, and a controller 24 connected to drives of the drive system for data exchange.

Each drive has a respective electric motor 26 fed by a respective inverter 25.

Each drive is assigned a respective distributor 4, which supplies the drive with electrical power via a first hybrid cable 1. In addition, a data cable 3 from the distributor 4 to the drive and a similar data cable 3 from the drive to the distributor 4 are routed in the system in which the drive system is arranged.

For example, the data cable 3 carries an Ethernet cable. This means that there is no stub line for the data cable 3, but rather a feed line to and a return line from the drive.

From the switch cabinet 21, e.g., from the controller 24, the distributors 4 are arranged in series, e.g., electrically in series, one behind the other.

A second hybrid cable 2 is routed from the switch cabinet 21 to the first of the distributors 4, which second hybrid cable 2 has a low-voltage line 5, e.g., a phase line of the three-phase voltage network, a neutral conductor 6, an extra-low voltage line 7, and, for example, a shielded data line 8.

A second hybrid cable 2 of the same type is routed from the respective distributor 4 to the distributor 4 respectively downstream in the series, and the cable lengths of the hybrid cables 2 are suitably selected in each case.

The two second hybrid cables 2 routed to a respective distributor 4 are led through cable glands 30 of the distributor into the interior of the distributor 4, and the low-voltage lines 5, e.g., the phase lines of the three-phase voltage supply network and the neutral conductor 6 are looped through.

The first hybrid cable 1 is also led through a cable gland 32 of the distributor 4 into its interior.

For each mains phase, a stub line with the corresponding phase of the low-voltage line of the first hybrid cable 1 is led from the respective low-voltage line 5 of the second hybrid cable 2.

Similarly, from the neutral conductor 6 looped through between the two second hybrid cables 2, a stub line branches off to the neutral conductor 6 of the first hybrid cable 1.

However, the data line 8 of the first of the two second hybrid cables 2 is led to the drive in the data cable 3, which is arranged as a feed line, so that data can be fed to the inverter located there, which is arranged as a bus subscriber.

From this inverter, however, the data cable 3, which is arranged as a return line, is connected in the distributor to the data line of the second of the two second hybrid cables 2.

The stub lines leading to the low-voltage line of the first hybrid cable 1 can be disconnected via a switch 9.

Figure 3:
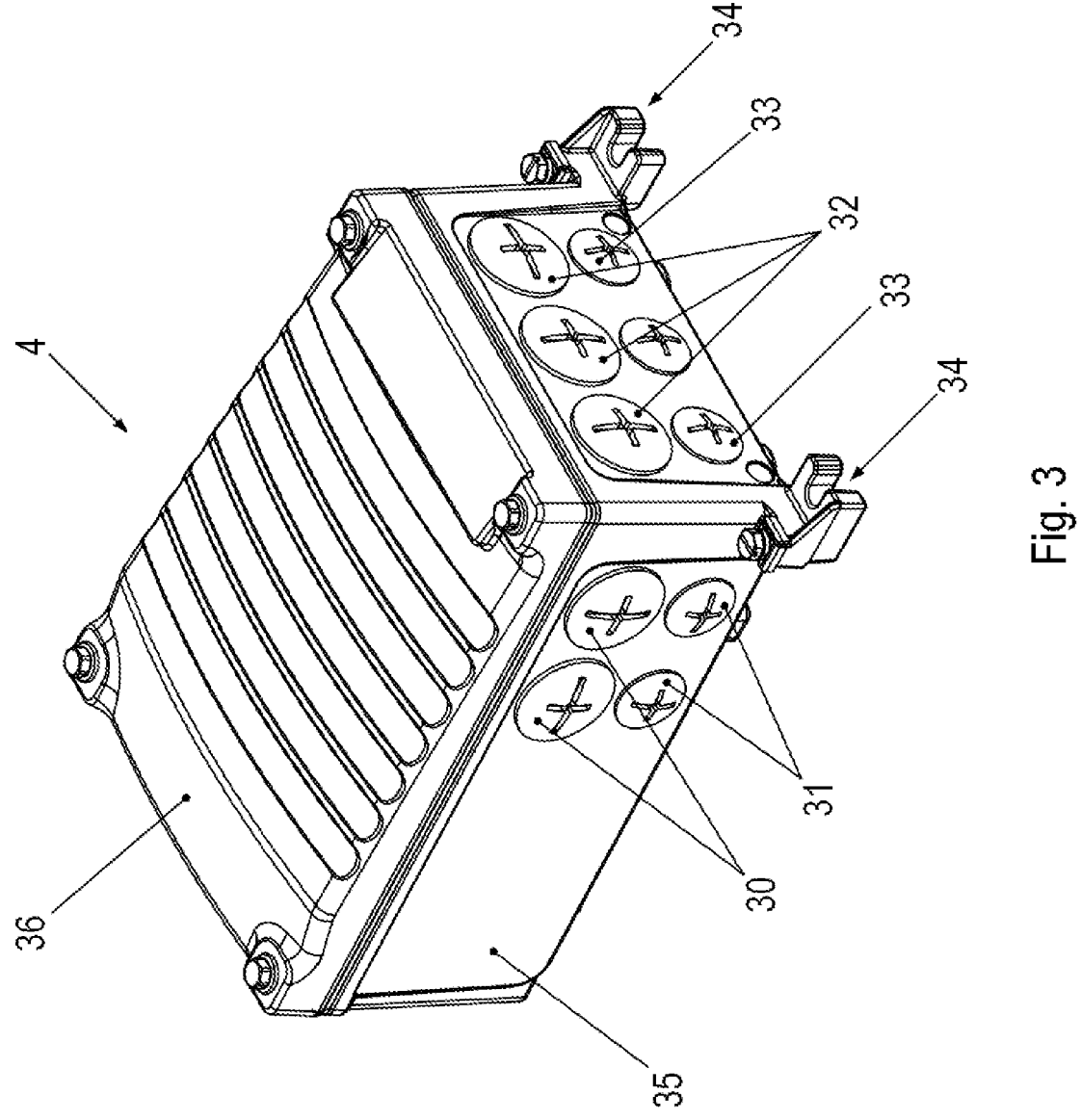
FIG. 3 is a perspective view of the distributor.
Figure 4:
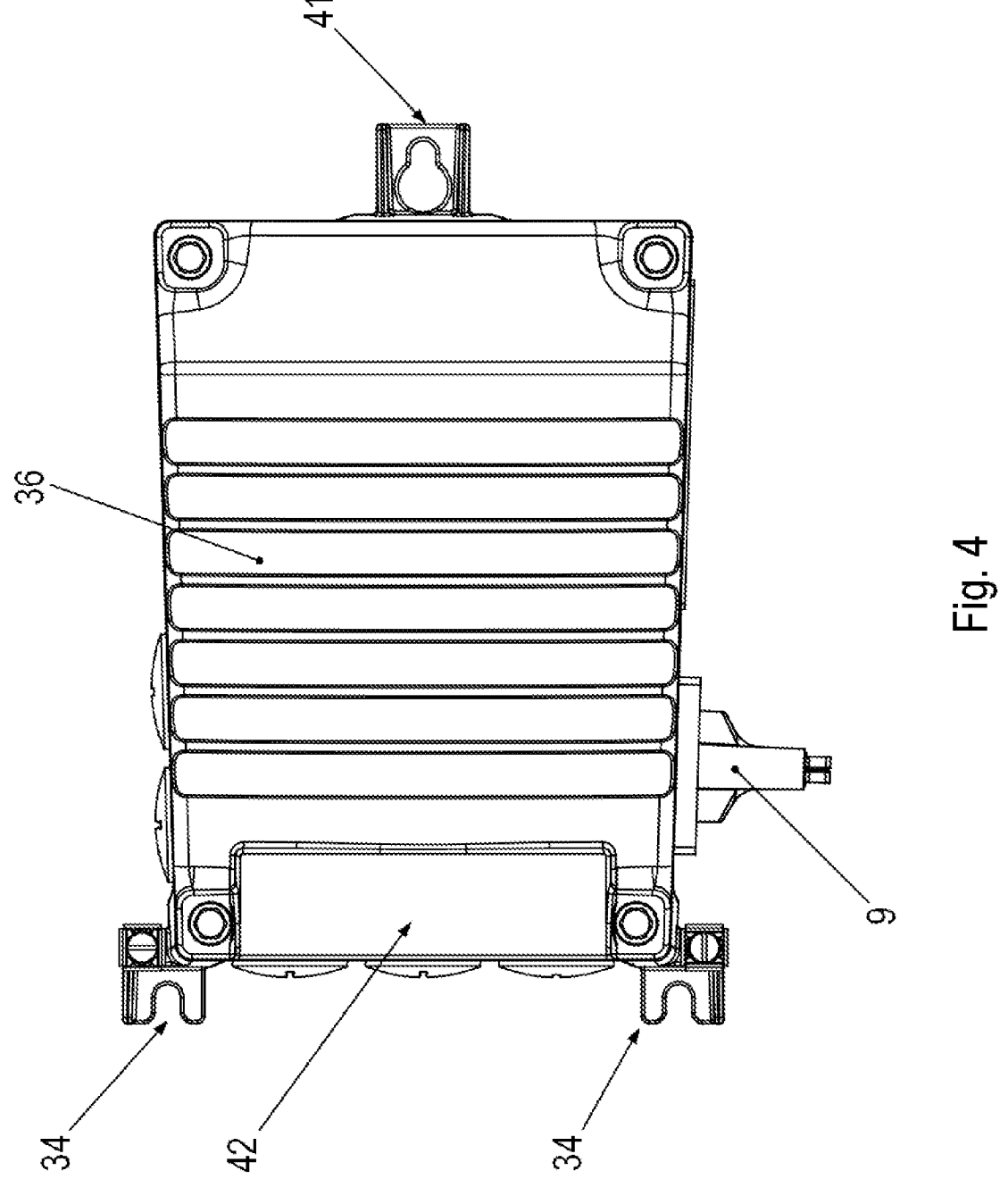
FIG. 4 is a top view of the distributor.
Figure 5:
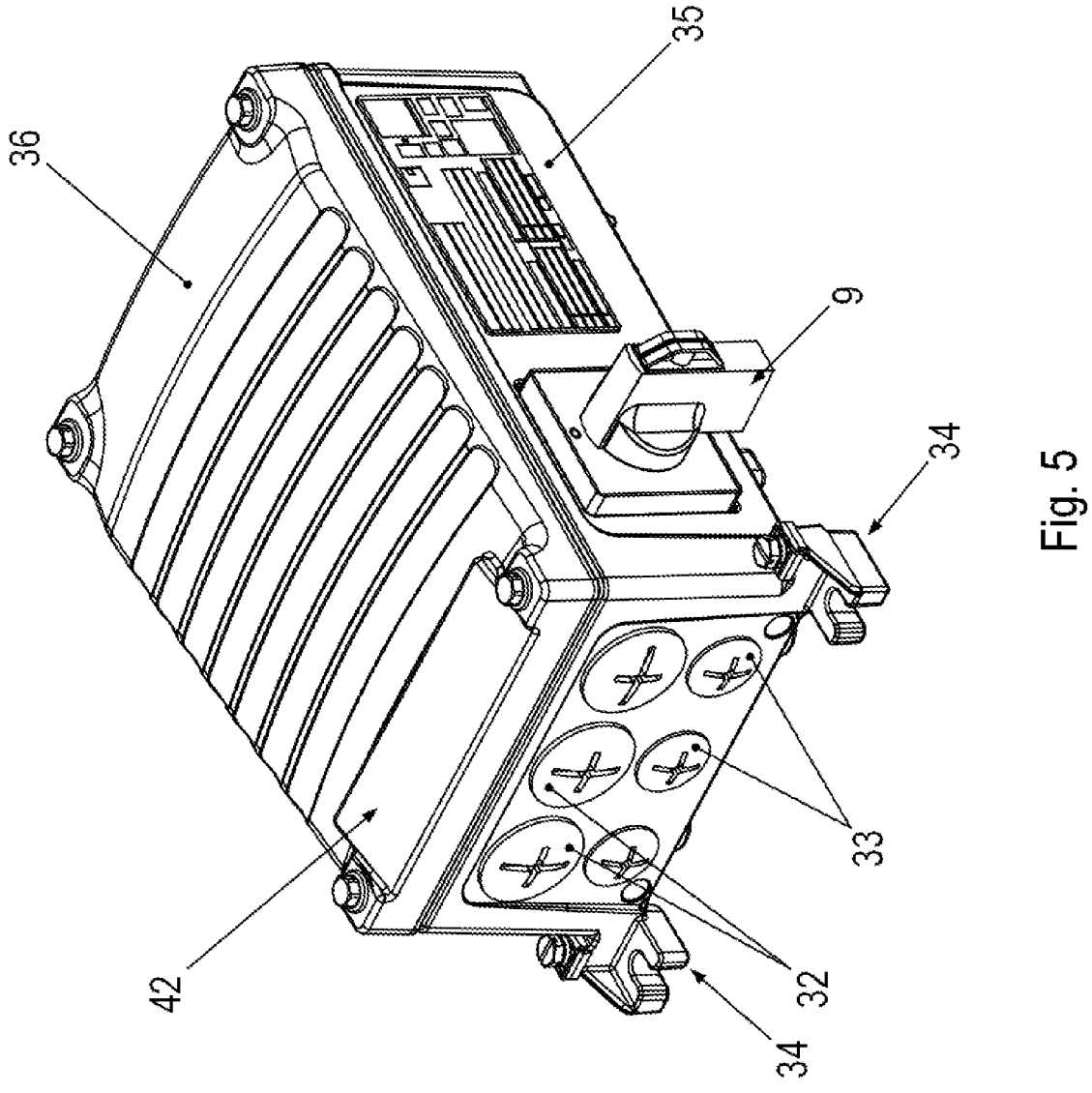
FIG. 5 is a perspective view of the distributor.

As illustrated in FIG. 3 and FIG. 4, the distributor 4 has a lower part 35 and an upper part 36 placed on the lower part 35. The lower part 35 and the upper part 36 thus form a substantially cuboid box.

On the bottom side of the distributor 4, respectively U-shaped foot parts 34 are arranged, and an eyelet 41, the clear inside diameter of which decreases with increasing distance at least in a partial region of the eyelet 41.

In this manner, wall fastening is possible on three bolts or screws protruding from the wall, and the U-shaped foot parts 34 are, for example, aligned downwards, e.g., against the vertical direction.

One of the bolts or one of the screws protrudes through the eyelet 41, so that by moving the distributor 4 in the vertical direction, the distributor 4 rests on two of the bolts or screws and at the same time the third bolt or the third screw rests against a narrowed point of the eyelet 41.

The upper part 36 has a flat surface area that is used for labeling.

On one front side, the lower part 35 has a cable gland 32, through which the first hybrid cable 1 is led into the interior of the distributor 4, e.g., with a high degree of protection.

In addition, the two data cables 3 are led into the interior of the distributor 4 through corresponding cable glands 33.

In addition, further cable glands 33, 32 are arranged at the front side, but these are unused.

The switch 9 is arranged on a first side adjacent to the front side so that the drive can be switched off.

Cable glands 30 are arranged on a second side of the lower part 35 opposite the first side, through each of which a second hybrid cable 2 is led into the interior of the distributor 4, e.g., with a high degree of protection.

In addition, cable glands 31 are also arranged on the second side of the lower part 35, which are unused. However, these further cable glands 31 are suitably arranged so that a data cable, e.g., with a high degree of protection, can be led through each of these further cable glands 31 into the interior of the distributor 4.

Thus, the lower part 35 can also be used if cables are used instead of the hybrid cables 1, 2, and low-voltage lines are arranged separately in a low-voltage cable and extra-low voltage lines separately in an extra-low voltage cable and data lines separately in a data cable.

The lower part 35 can thus be used with either hybrid cables 1, 2 or other cables.

An advantage of using hybrid cables 1, 2 is that the wiring can be carried out quickly and readily during production with installation of the drive system. Inexpensive standard cables can be used without using the hybrid cables 1, 2. The use is thus selected or not selected, depending on requirements.

In any case, the flat surface section of the upper part 36 serves as a labeling surface 42, so that the assignment of the cable glands is indicated.

The switch 9 can be actuated from the outside.

According to example embodiments, the distributor 4 is fastened to the wall of the system such that the front side is aligned downwards in the direction of gravity, e.g., so that the normal vector of the straight front side is aligned parallel to the vertical direction. This means that the weight of the first hybrid cable 1, in addition to the weight of the distributor 4, is transferred via the foot parts 34 and the bolts or screws fastened in the wall. This means that the fastening of distributor 4 to the wall is implemented with increased safety.

LIST OF REFERENCE NUMERALS

1 First hybrid cable
2 Second hybrid cable
3 Data cable, e.g., shielded cable
4 Distributor
5 Low-voltage line, e.g., phase line of the three-phase network
6 Neutral conductor
7 Extra-low voltage line
8 Data line
9 Switch
20 IO module, e.g., module with inputs and outputs
21 Switch cabinet
22 Low-voltage connection
23 Extra-low voltage connection
24 Controller
30 Cable gland for second hybrid cable
31 Cable gland for data cable or extra-low voltage cable
32 First cable gland for first hybrid cable
33 Cable gland for data cable or extra-low voltage cable
34 Foot part with groove or recess
35 Lower part
36 Upper part
41 Eyelet region of the lower part 35
42 Labeling surface

The invention claimed is:
1. A drive system, comprising:
   a central module;

6 a plurality of distributors; and a plurality drives, each drive corresponding to a respective distributor;

wherein each drive is connected to the respective distributor by a first hybrid cable that extends from the drive through a first cable gland of the respective distributor into the respective distributor and by a first data cable and by a second data cable that extend from the drive through a respective third cable gland of the respective distributor into the respective distributor;

wherein a first second hybrid cable extends from the central module through a first second cable gland of a first one of the distributors into the first one of the distributors; and wherein a second second hybrid cable extends from a second second cable gland of the first one of the distributors through a first second cable gland of a downstream one of the distributors into the downstream one of the distributors.

2. The drive system according to claim 1, wherein the distributors are arranged in a line and/or in a series.

3. The drive system according to claim 1, wherein the distributor includes a lower part having an eyelet.

4. The drive system according to claim 3, wherein a clear inside diameter of the eyelet decreases and/or monotonously decreases with increasing distance from the first cable gland.

5. The drive system according to claim 4, the clear inside diameter is measured perpendicular to a straight line connecting the eyelet and the first cable gland.

6. The drive system according to claim 3, wherein the lower part includes U-shaped foot parts having legs adapted to accommodate first bolts therethrough, and the eyelet is adapted to receive a second bolt therethrough to fasten to a wall.

7. The drive system according to claim 6, wherein the eyelet has a clear inside diameter that decreases with increasing distance from the foot parts.

8. The drive system according to claim 6, wherein the eyelet has a clear inside diameter that decreases with increasing distance from the foot parts measured transversely to a connecting line between the eyelet and a center of gravity of the foot parts.

9. The drive system according to claim 1, wherein the central module is arranged in a switch cabinet.

10. The drive system according to claim 1, wherein the central module includes a low-voltage connection, an extra-low-voltage connection, and a controller connected to the drives and adapted for data exchange.

11. The drive system according to claim 10, wherein the low-voltage connection is adapted to connect to a three-phase voltage network, and the extra-low voltage connection is adapted to supply 24-volt power supply.

12. The drive system according to claim 1, wherein the first hybrid cable includes low-voltage lines and extra-low-voltage lines.

13. The drive system according to claim 12, wherein the low-voltage lines include neutral conductors.

14. The drive system according to claim 1, wherein the second hybrid cable includes low-voltage lines, extra-low-voltage lines, and a data line.

15. The drive system according to claim 14, wherein the low-voltage lines include neutral conductors.

16. The drive system according to claim 14, wherein the data line of the first second hybrid cable is arranged through the second data cable and/or is electrically connected to a data line of the second data cable, and the data line of the second second hybrid cable is arranged through the second data cable and/or is electrically connected to the data line of the second data cable.

17. The drive system according to claim 1, wherein the distributor has a lower part and an upper part arranged on the lower part, and all cable glands are arranged on the lower part.

18. The drive system according to claim 17, wherein the lower part includes a switch adapted to be actuated from outside and/or from an outer environment of the lower part, the switch adapted to disconnect and/or electrically disconnect low-voltage lines of the first hybrid cable.

19. The drive system according to claim 17, wherein the lower part is box-shaped.

20. The drive system according to claim 17, wherein the lower part includes a bottom wall, a front wall adjacent to the bottom wall, a first side wall adjacent to the bottom wall and to the front wall, and a second side wall adjacent to the bottom wall and to the front wall and arranged at a distance from the first side wall.

21. The drive system according to claim 20, wherein the second side wall is aligned parallel to the first side wall and/or arranged opposite the first side wall on the lower part.

22. The drive system according to claim 20, wherein the first cable gland is arranged in the front wall, the third cable gland is arranged in the front wall, the second cable gland is arranged in the second side wall, and/or a switch adapted to disconnect low-voltage lines of the first hybrid cable is arranged in the first side wall.

23. The drive system according to claim 17, wherein the upper part has a flat surface section arranged as a labeling surface and having a smaller distance to the first, second and/or third cable gland than to an eyelet of the lower part.

24. The drive system according to claim 17, wherein further cable glands and/or unused cable glands are arranged on the lower part and/or on a front wall and a second side wall of the lower part.

* * * * *